US012580538B2

(12) United States Patent
Tahara et al.

(10) Patent No.: US 12,580,538 B2
(45) Date of Patent: Mar. 17, 2026

(54) RADIO-FREQUENCY MODULE AND COMMUNICATION APPARATUS

(71) Applicant: Murata Manufacturing Co., Ltd., Nagaokakyo (JP)

(72) Inventors: Kenji Tahara, Nagaokakyo (JP); Yoshiaki Sukemori, Nagaokakyo (JP); Kae Yamamoto, Nagaokakyo (JP); Ryo Wakabayashi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 324 days.

(21) Appl. No.: 18/509,464

(22) Filed: Nov. 15, 2023

(65) Prior Publication Data

US 2024/0097629 A1 Mar. 21, 2024

Related U.S. Application Data

(63) Continuation of application No. PCT/JP2022/022227, filed on May 31, 2022.

(30) Foreign Application Priority Data

Jun. 2, 2021 (JP) ................................. 2021-093020

(51) Int. Cl.
*H04B 1/04* (2006.01)
*H03F 1/02* (2006.01)
*H03F 3/24* (2006.01)

(52) U.S. Cl.
CPC ........... *H03F 3/245* (2013.01); *H03F 1/0288* (2013.01); *H04B 1/04* (2013.01); *H03F 2200/451* (2013.01)

(58) Field of Classification Search
CPC ..................... H04B 1/04; H04B 1/0458; H04B 2001/0408; H04B 1/40; H03F 1/02; H03F 1/0288; H03F 3/195; H03F 3/189; H03F 3/245; H03F 3/60; H03F 3/68; H03F 2200/451
See application file for complete search history.

(56) References Cited

U.S. PATENT DOCUMENTS

| | | | | |
|---|---|---|---|---|
| 7,053,708 B2 * | 5/2006 | Nagamori | ............... | H03F 3/195 |
| | | | | 330/133 |
| 10,566,938 B1 * | 2/2020 | Schultz | ................. | H03F 1/0288 |
| 11,522,506 B2 * | 12/2022 | Shilimkar | ............... | H03F 3/245 |
| 12,074,995 B2 * | 8/2024 | Tomita | .................... | H03F 3/189 |

FOREIGN PATENT DOCUMENTS

| | | |
|---|---|---|
| JP | H11-340707 A | 12/1999 |
| JP | 2013-085179 A | 5/2013 |
| JP | 2021-061577 A | 4/2021 |
| WO | 2018/109930 A1 | 6/2018 |

OTHER PUBLICATIONS

International Search Report and Written Opinion mailed on Sep. 6, 2022, received for PCT Application PCT/JP2022/022227, filed on May 31, 2022, 8 pages including English Translation.

* cited by examiner

*Primary Examiner* — Quochien B Vuong
(74) *Attorney, Agent, or Firm* — XSENSUS LLP

(57) ABSTRACT

A radio-frequency module includes a module substrate, a carrier amplifier and a peak amplifier, a transformer, and a phase adjustment circuit. The carrier amplifier and the peak amplifier are included in a semiconductor IC. One end of an input-side coil is connected to an output terminal of the carrier amplifier. One end of the output-side coil is connected to a signal output terminal.

20 Claims, 6 Drawing Sheets

CARRIER AMPLIFIER ON
PEAK AMPLIFIER ON $Zp = R_L \times \dfrac{2}{n}$

110

111  112
Carrier

11

51

2

34

Peak
121  122  12

52

301

200

$R_L$

302

120

$Zn = R_L \times \dfrac{2}{n}$ $R_L \times \dfrac{1}{n}$

CARRIER AMPLIFIER ON
PEAK AMPLIFIER OFF $Zp = R_L \times \dfrac{4}{n}$

110

111  112
Carrier

11

51

2

34

52

Peak
121  122  12

301

200

$R_L$

302

120 open $R_L \times \dfrac{1}{n}$

RADIO-FREQUENCY MODULE AND COMMUNICATION APPARATUS

CROSS REFERENCE TO RELATED APPLICATIONS

This is a continuation application of PCT/JP2022/022227, filed on May 31, 2022, designating the United States of America, which is based on and claims priority to Japanese Patent Application No. JP 2021-093020 filed on Jun. 2, 2021. The entire contents of the above-identified applications, including the specifications, drawings and claims, are incorporated herein by reference in their entirety.

TECHNICAL FIELD

The present disclosure relates to a radio-frequency module and a communication apparatus.

BACKGROUND ART

Patent Document 1 discloses a Doherty amplifier including a carrier amplifier and a peak amplifier, an impedance conversion circuit connected to an output terminal of the carrier amplifier, and a combining circuit that combines a signal output from the carrier amplifier with a signal output from the peak amplifier.

CITATION LIST

Patent Document

Patent Document 1: International Publication No. 2018/109930

SUMMARY

Technical Problem

However, in mounting circuit components composing the Doherty amplifier disclosed in Patent Document 1 on a module substrate, a radio-frequency module including the Doherty amplifier may be increased in size with increase in size of the impedance conversion circuit.

The present disclosure provides a compact radio-frequency module including a Doherty amplifier and a communication apparatus.

Solution to Problem

In the present disclosure, a radio-frequency module includes a module substrate, a first amplifier and a second amplifier, a transformer including an input-side coil and an output-side coil, a signal output terminal, and a first circuit. The first amplifier and the second amplifier are included in a semiconductor IC arranged on a main surface of the module substrate. One end of the input-side coil is connected to an output terminal of the first amplifier. One end of the output-side coil is connected to the signal output terminal. The other end of the output-side coil is grounded. The first circuit includes a first transmission line and a second transmission line, and a first capacitive element. One end of the first transmission line is connected to an output terminal of the second amplifier, the other end of the first transmission line is connected to one end of the second transmission line, and the other end of the second transmission line is connected to the other end of the input-side coil. One end of the first capacitive element is connected to the other end of the first transmission line and the one end of the second transmission line and the other end of the first capacitive element is grounded. The first capacitive element is included in the semiconductor IC.

A radio-frequency module in the present disclosure includes a module substrate, a first amplifier and a second amplifier, a signal output terminal, and a first circuit and a second circuit. The first amplifier and the second amplifier are included in a semiconductor IC arranged on a main surface of the module substrate. The first circuit includes a first transmission line and a second transmission line, and a first capacitive element. One end of the first transmission line is connected to an output terminal of the first amplifier, the other end of the first transmission line is connected to one end of the second transmission line, and the other end of the second transmission line is connected to an output terminal of the second amplifier. One end of the first capacitive element is connected to the other end of the first transmission line and the one end of the second transmission line and the other end of the first capacitive element is grounded. The second circuit includes a first primary line and a first secondary line. One end of the first primary line is connected to the other end of the second transmission line and the other end of the first primary line is connected to the signal output terminal. One end of the first secondary line is connected to the one end of the first primary line and the other end of the first secondary line is grounded. Assuming the first primary line and the first secondary line are viewed from a direction orthogonal to the direction in which the first primary line and the first secondary line extend, a first direction from the one end to the other end of the first primary line is the same as a second direction from the other end to the one end of the first secondary line. The first capacitive element is included the semiconductor IC.

Effects of the Present Disclosure

According to the present disclosure, it is possible to provide a compact radio-frequency module including a Doherty amplifier and a communication apparatus.

DESCRIPTION OF EMBODIMENTS

Figure 1:
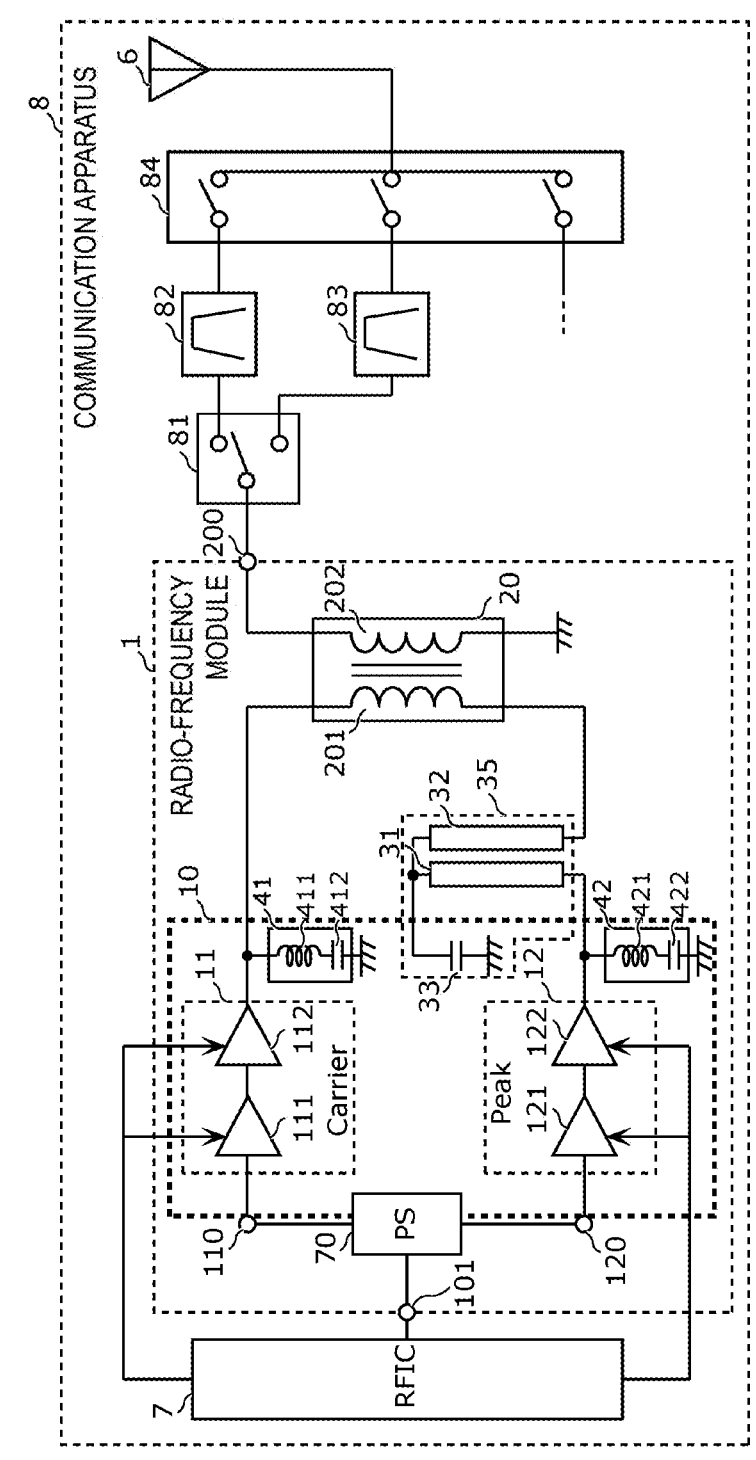
FIG. 1 is a circuit configuration diagram of a radio-frequency module and a communication apparatus according to a first embodiment.

Aspects of the present disclosure will herein be described in detail with reference to the drawings. All the aspects described below indicate comprehensive or specific examples. Numerical values, shapes, materials, components, the arrangement of the components, the connection mode of the components, and so on, which are indicated in the aspects described below, are only examples and are not intended to limit the present disclosure.

The respective drawings are schematic diagrams appropriately subjected to emphasis, omission, or adjustment of ratios in order to describe the present disclosure. The respective drawings are not necessarily strictly illustrated and may be different from the actual shapes, positional relationship, and ratios. The same reference numerals are used in the respective drawings to identify substantially the same components and a duplicated description of such components may be omitted or simplified.

In the present disclosure, "connected" corresponds to inclusion of not only direct connection with a connection terminal and/or a wiring conductor but also electrical connection via another circuit element. "Connected between A and B" corresponds to connection to A and B on a path between A and B.

In the present disclosure, a "plan view" corresponds to viewing an object that is orthographically projected on the x-y plane from the positive direction side of the z axis. "Arrangement of a component on a main surface of a substrate" includes arrangement of the component above the main surface without being in contact with the main surface and embedding of part of the component in the substrate from the main surface side, in addition to arrangement of the component on the main surface with being in contact with the main surface of the substrate.

"Arrangement of C between A and B in a plan view of a substrate (or a main surface of the substrate)" for A, B, and C mounted on the substrate in the description below corresponds to passing of at least one line segment, among multiple line segments connecting an arbitrary point in A to an arbitrary point in B, through the area of C in a plan view of the substrate. In addition, a "plan view of a substrate" corresponds to viewing the substrate and circuit elements mounted on the substrate, which is orthographically projected on a plane parallel to a main surface of the substrate.

In the present disclosure, the terms, such as parallel and vertical, indicating the relationship between elements and the terms, such as rectangles, indicating the shapes of the elements do not represent only strict meanings but mean inclusion of a substantially equal range, for example, a difference on the order of few percent. In addition, "a first direction is the same as a second direction" is not limited to a state in which the angle between the direction vector of the first direction and the direction vector of the second direction is strictly zero degrees but is defined to include a state in which the angle between the two direction vectors is wider than or equal to −10 degrees and is narrower than or equal to +10 degrees.

In the present disclosure, a "signal path" corresponds to a transmission line composed of wiring on which a radio-frequency signal is propagated, electrodes directly connected to the wiring, terminals directly connected to the wiring or the electrodes, and so on.

First Aspect

1. Circuit Configuration of Radio-Frequency Module 1 and Communication Apparatus 8

A circuit configuration of a radio-frequency module 1 and a communication apparatus 8 according to the present aspect will be described with reference to FIG. 1. FIG. 1 is a circuit configuration diagram of the radio-frequency module 1 and the communication apparatus 8 according to a first aspect.

1.1 Circuit Configuration of Communication Apparatus 8

First, a circuit configuration of the communication apparatus 8 will be described. As illustrated in FIG. 1, the communication apparatus 8 according to the present aspect includes the radio-frequency module 1, an antenna 6, a radio-frequency (RF) signal processing circuit (a radio-frequency integrated circuit (RFIC)) 7, filters 82 and 83, and switches 81 and 84.

The radio-frequency module 1 transmits a radio-frequency signal between the antenna 6 and the RFIC 7. A detailed circuit configuration of the radio-frequency module 1 will be described below.

The antenna 6 is connected to the switch 84. The radio-frequency signal supplied from the radio-frequency module 1 is transmitted through the antenna 6. In addition, the radio-frequency signal is externally received through the antenna 6 and the received signal is supplied to the radio-frequency module 1.

The RFIC 7 is one example of a signal processing circuit that processes the radio-frequency signal. Specifically, the RFIC 7 performs signal processing, such as down-conversion, to a reception signal input through a reception path of the radio-frequency module 1 and supplies a reception signal resulting from the signal processing to a baseband signal processing circuit (a baseband integrated circuit (BBIC)) (not illustrated). In addition, the RFIC 7 performs signal processing, such as up-conversion, to a transmission signal supplied from the BBIC and supplies a transmission signal resulting from the signal processing to a transmission path of the radio-frequency module 1. Furthermore, the RFIC 7 includes a control unit that controls switches, amplifying elements, and so on. Part or all of the functions of the RFIC 7 serving as the control unit may be provided outside the RFIC 7. For example, part or all of the functions of the RFIC 7 serving as the control unit may be installed in the BBIC or the radio-frequency module 1.

The RFIC 7 also has a function serving as a control unit that controls power supply voltage Vcc and bias voltage Vbias, which are to be supplied to the respective amplifiers in the radio-frequency module 1. Specifically, the RFIC 7 supplies a digital control signal to the radio-frequency module 1. The power supply voltage Vcc and the bias voltage Vbias controlled in response to the digital control signal are supplied to the respective amplifiers in the radio-frequency module 1.

The RFIC 7 also has a function serving as a control unit that controls connection of the switches 81 and 84 based on a communication band (frequency band) that is used.

The filter 82 is connected between the switches 81 and 84 and transmits the transmission signal of the transmission band of Band A, among the transmission signals output from the radio-frequency module 1. The filter 83 is connected between the switches 81 and 84 and transmits the transmission signal of the transmission band of Band B, among the transmission signals output from the radio-frequency module 1.

In the present aspect, each of Band A and Band B corresponds to a frequency band defined in advance by standards bodies or the likes (for example, 3rd Generation Partnership Project (3GPP) (registered trademark) or Institute of Electrical and Electronics Engineers (IEEE)) for a communication system that is built using a radio access technology (RAT). Although, for example, a 4th-generation (4G)-Long Term Evolution (LTE) system, a 5th-generation (5G)-New Radio (NR) system, a wireless local area network (WLAN) system, or the like is capable of being used as the communication system in the present aspect, the communication system is not limited to these systems.

Each of the filters 82 and 83 may compose a duplexer with a reception filter or may be one filter using a Time Division Duplex (TDD) method. Assuming the filters 82 and 83 are the TDD filters, a switch that switches between transmission and reception is arranged at least one of upstream of the one filter and downstream of the one filter.

The switch 81 has a common terminal, a first selection terminal, and a second selection terminal. The common terminal is connected to a signal output terminal 200 of the radio-frequency module 1. The first selection terminal is connected to the filter 82 and the second selection terminal is connected to the filter 83. In this connection configuration, the switch 81 switches between connection between the radio-frequency module 1 and the filter 82 and connection between the radio-frequency module 1 and the filter 83.

The switch 84 is one example an antenna switch and is connected to the antenna 6. The switch 84 switches between connection and non-connection between the antenna 6 and the filter 82 and switches between connection and non-connection between the antenna 6 and the filter 83.

The communication apparatus 8 may include a reception circuit for transmitting the reception signal received through the antenna 6 to the RFIC 7. In this case, the communication apparatus 8 includes a low noise amplifier and the reception filter.

An impedance matching circuit may be arranged between the signal output terminal 200 and the antenna 6.

With the above circuit configuration, the communication apparatus 8 is capable of transmitting or receiving the radio-frequency signal of Band A or Band B. In addition, the communication apparatus 8 is capable of performing at least one of simultaneous transmission, simultaneous reception, and simultaneous transmission-reception of the radio-frequency signals of Band A and Band B.

In the communication apparatus 8 according to the present aspect, the antenna 6, the switches 81 and 84, and the filters 82 and 83 may be optional components.

1.2 Circuit Configuration of Radio-Frequency Module 1

Next, a circuit configuration of the radio-frequency module 1 will be described. As illustrated in FIG. 1, the radio-frequency module 1 includes a carrier amplifier 11, a peak amplifier 12, a phase-shift circuit 70, a transformer 20, a phase adjustment circuit 35, LC series circuits 41 and 42, a signal input terminal 101, and the signal output terminal 200. The radio-frequency module 1 is a Doherty amplifier circuit that amplifies the transmission signals of Band A and Band B input through the signal input terminal 101. The radio-frequency module 1 may separately include a first Doherty amplifier circuit that amplifies the radio-frequency signal of Band A and a second Doherty amplifier circuit that amplifies the radio-frequency signal of Band B.

The phase-shift circuit 70 splits the signal input through the signal input terminal 101 and supplies the two signals resulting from the split to the carrier amplifier 11 and the peak amplifier 12 through terminals 110 and 120, respectively. The phase-shift circuit 70 adjusts the phases of the two signals resulting from the split. For example, the phase-shift circuit 70 shifts one of the two signals resulting from the split from the other thereof by −90 degrees (delays one of the two signals resulting from the split from the other thereof by 90 degrees).

The configuration of the phase-shift circuit 70 is not limited to the above one. For example, the phase-shift circuit 70 may be arranged upstream of each of the carrier amplifier 11 and the peak amplifier 12. Alternatively, the phase-shift circuit 70 may be arranged between a pre-amplifier 111 and a carrier amplifier 112 and between a pre-amplifier 121 and a peak amplifier 122. The radio-frequency module 1 does not necessarily include the phase-shift circuit 70 and the pre-amplifiers 111 and 121.

The carrier amplifier 11 is one example of a first amplifier and includes the pre-amplifier 111 and the carrier amplifier 112 that are cascade-connected to each other. The pre-amplifier 111 is one of multiple first amplifying elements and is arranged upstream of the carrier amplifier 112. The carrier amplifier 112 is one of the multiple first amplifying elements and is arranged at the final stage, among the multiple first amplifying elements that are cascade-connected to each other.

The peak amplifier 12 is one example of a second amplifier and includes the pre-amplifier 121 and the peak amplifier 122 that are cascade-connected to each other. The pre-amplifier 121 is one of multiple second amplifying elements and is arranged upstream of the peak amplifier 122. The peak amplifier 122 is one of the multiple second amplifying elements and is arranged at the final stage, among the multiple second amplifying elements that are cascade-connected to each other.

Each of the pre-amplifiers 111 and 121, the carrier amplifier 112, and the peak amplifier 122 includes an amplifier transistor. The amplifier transistor is, for example, a bipolar transistor, such as a heterojunction bipolar transistor (HBT), or a field effect transistor, such as metal-oxide-semiconductor field effect transistor (MOSFET).

The carrier amplifier 112 is an A-class (or AB-class) amplifier circuit capable of performing an amplification operation for the power levels of all the signals input through the terminal 110 and is capable of performing the highly efficient amplification operation particularly in a low output region and a middle output region. It is sufficient for the first amplifier according to the present disclosure to include the A-class (or the AB-class) amplifier circuit and the first amplifier according to the present disclosure is not limited to the carrier amplifier.

In this description, the efficiency indicates power-added efficiency.

The peak amplifier 122 is, for example, a C-class amplifier circuit capable of performing the amplification operation in a region having a higher power level of the signal input through the terminal 120. Since the bias voltage lower than the bias voltage applied to the amplifier transistor in the carrier amplifier 112 is applied to the amplifier transistor in the peak amplifier 122, output impedance is decreased with the increasing power level of the input signal. Accordingly, the peak amplifier 122 is capable of performing the amplification operation with low distortion in a high output region. It is sufficient for the second amplifier according to the present disclosure to include the C-class amplifier circuit and the second amplifier according to the present disclosure is not limited the peak amplifier.

The carrier amplifier 11 including the pre-amplifier 111 and the carrier amplifier 112 is described below as the A-class (or the AB-class) amplifier circuit capable of performing the highly efficient amplification operation in the low output region and the middle output region, and the peak amplifier 12 including the pre-amplifier 121 and the peak amplifier 122 is described below as the C-class amplifier circuit capable of performing the amplification operation with low distortion in the high output region, unless otherwise specified.

The transformer 20 includes an input-side coil 201 and an output-side coil 202.

One end of the input-side coil 201 is connected to an output terminal of the carrier amplifier 11. One end of the output-side coil 202 is connected to the signal output terminal 200 and the other end of the output-side coil 202 is grounded.

The phase adjustment circuit 35 is one example of a first circuit. The phase adjustment circuit 35 includes transmission lines 31 and 32 and a capacitor 33 and shifts the phase of the signal input into the phase adjustment circuit 35 by approximately −90 degrees (delays the phase of the signal input into the phase adjustment circuit 35 by 90 degrees). The transmission line 31 is one example of a first transmission line and is a circuit element that shifts the phase of the signal transmitted through the line. The transmission line 32 is one example of a second transmission line and is a circuit element that shifts the phase of the signal transmitted through the line. The capacitor 33 is one example of a first capacitive element. The capacitor 33 may be a chip capacitor or may be composed of a planar conductor formed in a semiconductor substrate.

One end of the transmission line 31 is connected to an output terminal of the peak amplifier 12, the other end of the transmission line 31 is connected to one end of the transmission line 32, and the other end of the transmission line 32 is connected to the other end of the input-side coil 201. One end (one electrode) of the capacitor 33 is connected to the other end of the transmission line 31 and the one end of the transmission line 32 and the other end (the other electrode) of the capacitor 33 is grounded.

With the above connection configuration of the transformer 20, the signal output from the carrier amplifier 11 and the signal output from the phase adjustment circuit 35 are subjected to voltage addition and the combined output signal is output through the signal output terminal 200.

With the above connection configuration of the phase adjustment circuit 35, since the capacitor 33 is connected between a node between the transmission line 31 and the transmission line 32 and the ground, the total line length of the transmission line 31 and the transmission line 32 is capable of being set to a value shorter than ¼ wavelength.

The LC series circuit 41 is one example of a first series circuit. The LC series circuit 41 includes an inductor 411 (a first inductor) and a capacitor 412 (a second capacitive element) that are connected in series to each other. The LC series circuit 41 is connected between the output terminal of the carrier amplifier 11 and the ground. Although the capacitor 412, among the inductor 411 and the capacitor 412, is connected at the ground side in the present aspect, the inductor 411 may be connected at the ground side.

The LC series circuit 42 is one example of a second series circuit. The LC series circuit 42 includes an inductor 421 (the first inductor) and a capacitor 422 (the second capacitive element) that are connected in series to each other. The LC series circuit 42 is connected between the output terminal of the peak amplifier 12 and the ground. Although the capacitor 422, among the inductor 421 and the capacitor 422, is connected at the ground side in the present aspect, the inductor 421 may be connected at the ground side.

The inductors 411 and 421 may be planar conductors formed in a chip component and the substrate or may be composed of wiring, such as wires.

The LC series circuits 41 and 42 according to the present aspect do not limitedly have the circuit configuration in which the single inductor is connected in series to the single capacitor. For example, in the LC series circuit 41, a circuit including an inductor connected in parallel to the capacitor 412, in addition to the inductor 411 and the capacitor 412 connected in series to each other, is also defined as the LC series circuit according to the present disclosure. In the LC series circuit 42, a circuit including an inductor connected in parallel to the capacitor 422, in addition to the inductor 421 and the capacitor 422 connected in series to each other, is also defined as the LC series circuit according to the present disclosure.

The radio-frequency module 1 according to the present aspect does not necessarily include both of the LC series circuits 41 and 42 and it is sufficient for the radio-frequency module 1 according to the present aspect to include at least one of the LC series circuits 41 and 42.

In the LC series circuits 41 and 42, the inductance value of each inductor and the capacitance value of each capacitor are set so that an LC series resonant frequency coincides with the frequency of second harmonics of the signals output from the carrier amplifier 11 and the peak amplifier 12. Accordingly, it is possible to suppress the second harmonics occurring at each amplifier in the radio-frequency module 1.

1.3 Amplification Operation of Radio-Frequency Module 1

Figure 2A:
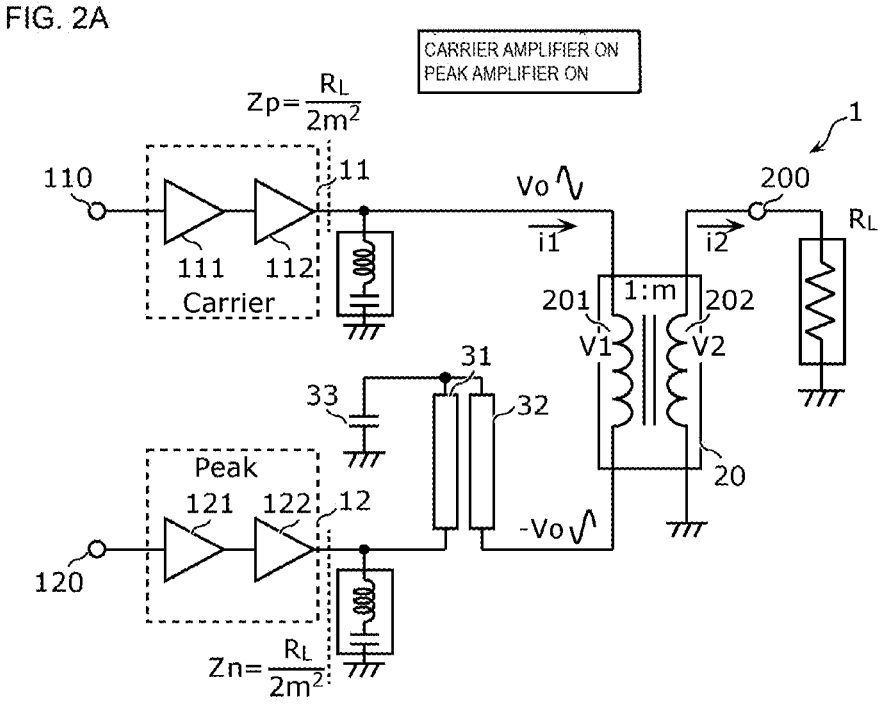
FIG. 2A is a circuit state diagram in input of a large signal in the radio-frequency module according to the first embodiment.
Figure 2B:
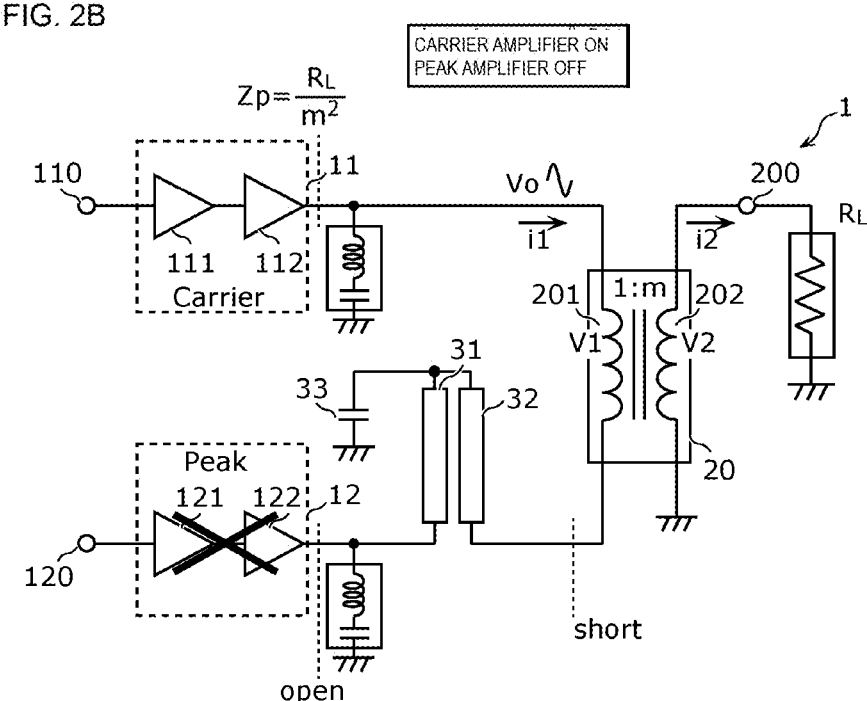
FIG. 2B is a circuit state diagram in input of a small signal in the radio-frequency module according to the first embodiment.

The amplification operation of the radio-frequency module 1 according to the present aspect will now be FIG. 2A is a circuit state diagram in input of a large signal in the radio-frequency module 1 according to the first aspect. FIG. 2B is a circuit state diagram in input of a small signal in the radio-frequency module 1 according to the first aspect.

First, as illustrated in FIG. 2A, assuming the carrier amplifier 11 and the peak amplifier 12 operate (are turned on) (in input of the large signal), output impedance Zp (hereinafter referred to as output impedance Zp of the carrier amplifier 11) assuming the side of a load is viewed from the output terminal of the carrier amplifier 11 and output impedance Zn (hereinafter referred to as output impedance Zn of the peak amplifier 12) assuming the load side is viewed from the output terminal of the peak amplifier 12 are represented according to Equations (1). It is assumed here that the transformer 20 performs voltage transformation at a ratio of 1:m. In Equations (1), the voltage applied to both ends of the input-side coil 201 is denoted by V1, the voltage applied to both ends of the output-side coil 202 is denoted by V2, the current flowing through the input-side coil 201 is denoted by i1, and the current flowing through the output-side coil 202 is denoted by i2. The output voltage from each amplifier is denoted by Vo. The impedance of the load connected to the signal output terminal 200 is denoted by RL.

$$V2 = mV1 = 2mVo, \quad i2 = \frac{1}{m}i1 \qquad \text{[Formula 1]}$$

$$RL = \frac{V2}{i2} = \frac{2m^2Vo}{i1}$$

$$Z_p = Zn = \frac{Vo}{i1} = \frac{RL}{2m^2}$$

Next, as illustrated in FIG. 2B, assuming the carrier amplifier 11 operates (is turned on) and the peak amplifier 12 does not operate (is turned off) (in input of the small signal), the output impedance Zp of the carrier amplifier 11 is represented according to Equations (2). The output impedance Zn of the peak amplifier 12 at this time is in an open state.

$$V2 = mV1 = mVo, \quad i2 = \frac{1}{m}i1 \qquad \text{[Formula 2]}$$

$$RL = \frac{V2}{i2} = \frac{m^2Vo}{i1}$$

$$Z_p = \frac{Vo}{i1} = \frac{RL}{m^2}$$

As expressed in Equations 1 and Equations 2, the output impedance Zp of the carrier amplifier 11 in input of the small signal is twice as high as that in input of the large signal. In other words, since the peak amplifier 12 is in an off state and the output impedance Zp of the carrier amplifier 11 is made high in input of the small signal, the radio-frequency module 1 is capable of operating at a high efficiency.

In contrast, since the carrier amplifier 11 and the peak amplifier 12 operate to output a high-power signal and the output impedance Zn of the peak amplifier 12 is low in input of the large signal, it is possible to suppress signal distortion.

1.4 Arrangement Configuration of Components in Radio-Frequency Module 1

Next, a mounting configuration of the components in the radio-frequency module 1 according to the first aspect will be described.

Figure 3A:
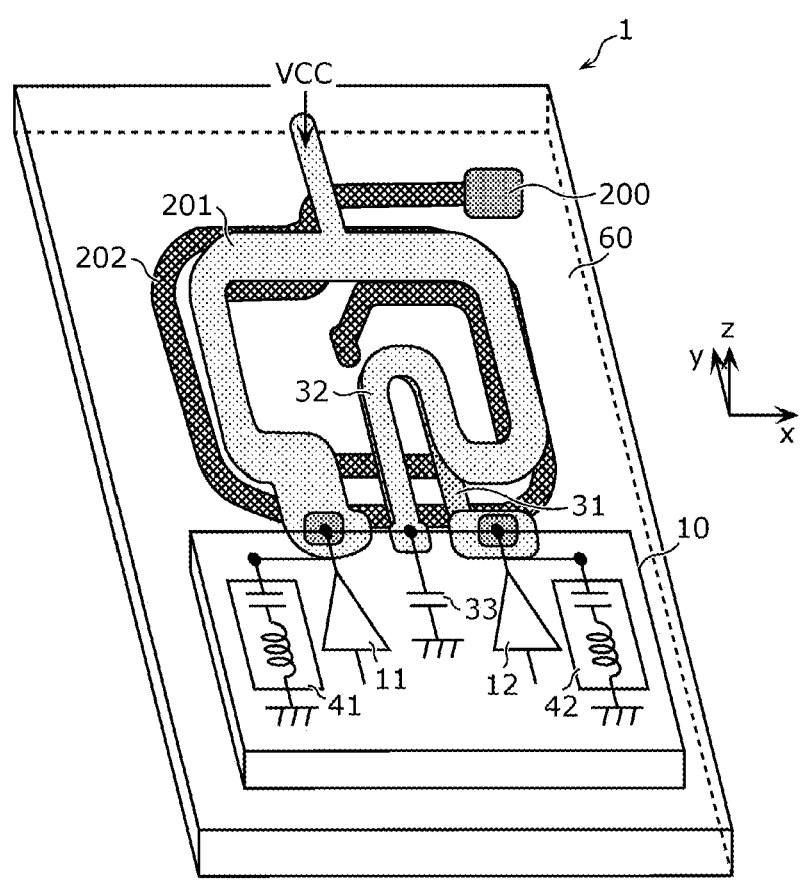
FIG. 3A is a perspective view of the radio-frequency module according to the first embodiment.
Figure 3B:
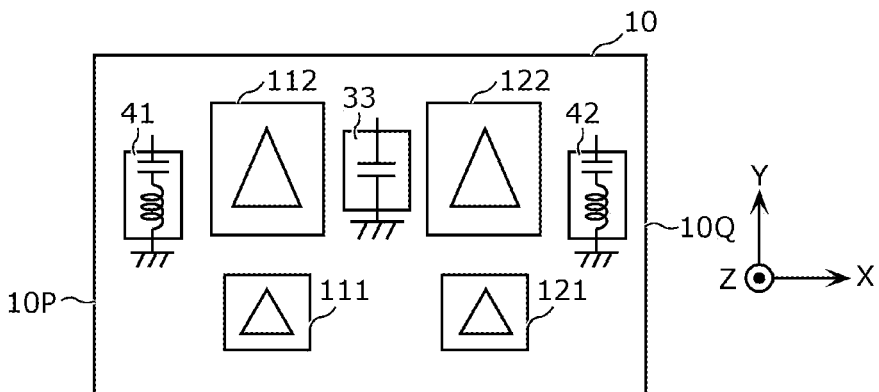
FIG. 3B is a plan view of the radio-frequency module according to the first embodiment.

FIG. 3A is a perspective view of the radio-frequency module 1 according to the first aspect. FIG. 3B is a plan view of the radio-frequency module 1 according to the first aspect. A perspective view of arrangement of circuit components assuming a main surface of a module substrate 60 is viewed from the positive direction side of the Z axis is illustrated in FIG. 3A. A perspective view of arrangement of the circuit components assuming a main surface of a semiconductor integrated circuit (IC) 10 is viewed from the positive direction side of the Z axis is illustrated in FIG. 3B. Although marks representing the functions of the respective circuit components may be added to the circuit components so as to enable easy understanding of the arrangement relationship of the respective circuit components in FIG. 3A and FIG. 3B, the marks are not added to the actual respective circuit components. Illustration of wiring with which the respective circuit components are connected to each other is omitted in FIG. 3B.

Although the radio-frequency module 1 may further include a resin member with which the surface of the module substrate 60 and part of the circuit components are covered and a shield electrode layer with which the surface of the resin member is covered, illustration of the resin member and the shield electrode layer is omitted in FIG. 3A.

The radio-frequency module 1 further includes the module substrate 60, in addition to the circuit configuration illustrated in FIG. 1.

The module substrate 60 is a substrate on and in which the circuit components composing the radio-frequency module 1 are mounted. For example, a low temperature co-fired ceramics (LTCC) substrate having a laminated structure of multiple dielectric layers, a high temperature co-fired ceramics (HTCC) substrate, a component-embedded board, a substrate including a redistribution layer (RDL), or a printed circuit board may be used as the module substrate 60.

The semiconductor IC 10 is arranged on the main surface of the module substrate 60. The semiconductor IC 10 includes the carrier amplifier 11, the peak amplifier 12, the capacitor 33, and the LC series circuits 41 and 42. The semiconductor IC 10 is composed of, for example, complementary metal oxide semiconductor (CMOS) and, specifically, may be manufactured through a silicon on insulator (SOI) process. The semiconductor IC 10 may be made of at least one of GaAs, SiGe, and GaN. The semiconductor material of the semiconductor IC 10 is not limited to the above materials. The phase-shift circuit 70 may be included in the semiconductor IC 10.

The input-side coil 201, the output-side coil 202, and the transmission lines 31 and 32 are formed on the surface of the module substrate 60 or in the module substrate 60. The input-side coil 201, the output-side coil 202, and the transmission lines 31 and 32 are composed of planar conductors formed on the surface of the module substrate 60 or in the module substrate 60. The input-side coil 201 and the transmission line 32 are formed on or in a first layer of the module substrate 60, the transmission line 31 is formed on or in a second layer thereof, and the output-side coil 202 is formed on or in a third layer thereof. The input-side coil 201, the output-side coil 202, and the transmission lines 31 and 32 may be formed on or in the same layer of the module substrate 60 or may be formed on or in different layers thereof. Each of the input-side coil 201, the output-side coil 202, and the transmission lines 31 and 32 may be formed across multiple layers.

With the above configuration, the total line length of the transmission lines 31 and 32 is capable of being set to a value shorter than ¼ wavelength due to the capacitor 33 and the capacitor 33 is included in the semiconductor IC 10 with the carrier amplifier 11 and the peak amplifier 12. Accordingly, it is possible to reduce the size of the radio-frequency module 1.

In addition, in a plan view of the module substrate 60, the capacitor 33 is arranged between the carrier amplifier 11 and the peak amplifier 12 in the semiconductor IC 10. With this configuration, since the space of the semiconductor IC 10 is capable of being effectively used, it is possible to contribute to the reduction in size of the radio-frequency module 1.

Furthermore, in a plan view of the module substrate 60, the capacitor 33 is arranged between the carrier amplifier 112 and the peak amplifier 122 in the semiconductor IC 10. With this configuration, since the wiring path between an output terminal of the carrier amplifier 112 and an output terminal of the peak amplifier 122 is capable of being shortened, it is possible to achieve reduction in transmission loss and the reduction in size of the radio-frequency module 1.

The capacitors 412 and 422 are included in the semiconductor IC 10. With this configuration, since the respective amplifiers and the capacitors 412 and 422 are included in the same semiconductor IC 10, it is possible to enforce the ground connected to the respective amplifiers and the capacitors 412 and 422 and to reduce the size of the radio-frequency module 1.

The inductors 411 and 421 are included in the semiconductor IC 10. With this configuration, it is possible to further reduce the size of the radio-frequency module 1.

In a plan view of the module substrate 60, the semiconductor IC 10 has an outer side 10P (a first outer side) and an outer side 10Q (a second outer side) that are opposed to each other and, as for the LC series circuits 41 and 42, the outer side 10P, the LC series circuit 41, the carrier amplifier 11, the peak amplifier 12, the LC series circuit 42, and the outer side 10Q are sequentially arranged. With this configuration, since the LC series circuit 41 and the LC series circuit 42 are arranged with the carrier amplifier 11 and the peak amplifier 12 sandwiched therebetween, it is possible to ensure the distance between the LC series circuit 41 and the LC series circuit 42. Accordingly, it is possible to suppress electromagnetic field coupling between the LC series circuit 41 and the LC series circuit 42.

1.5 Advantages and so on

As described above, the radio-frequency module 1 according to the present aspect includes the module substrate 60, the carrier amplifier 11 and the peak amplifier 12, the transformer 20 including the input-side coil 201 and the output-side coil 202, the signal output terminal 200, and the phase adjustment circuit 35. The carrier amplifier 11 and the peak amplifier 12 are included in the semiconductor IC 10 arranged on the main surface of the module substrate 60. One end of the input-side coil 201 is connected to the output terminal of the carrier amplifier 11, one end of the output-side coil 202 is connected to the signal output terminal 200, and the other end of the output-side coil 202 is grounded. The phase adjustment circuit 35 includes the transmission lines 31 and 32 and the capacitor 33. One end of the transmission line 31 is connected to the output terminal of the peak amplifier 12, the other end of the transmission line 31 is connected to one end of the transmission line 32, and the other end of the transmission line 32 is connected to the other end of the input-side coil 201. One end of the capacitor 33 is connected to the other end of the transmission line 31 and the one end of the transmission line 32, and the other end of the capacitor 33 is grounded. The capacitor 33 is included in the semiconductor IC 10.

With the above configuration, the total line length of the transmission lines 31 and 32 is capable of being set to a value shorter than ¼ wavelength due to the capacitor 33 and the capacitor 33 is included in the semiconductor IC 10 with the carrier amplifier 11 and the peak amplifier 12. Accordingly, it is possible to reduce the size of the radio-frequency module 1.

For example, the radio-frequency module 1 may further include at least one of the LC series circuit 41 connected between the output terminal of the carrier amplifier 11 and the ground and the LC series circuit 42 connected between the output terminal of the peak amplifier 12 and the ground.

With the above configuration, it is possible to suppress high-order harmonics occurring from the carrier amplifier 11 and the peak amplifier 12.

For example, in the radio-frequency module 1, the LC series circuit 41 may include the capacitor 412 and the inductor 411 that are connected in series to each other, and the capacitor 412 may be included in the semiconductor IC 10.

With the above configuration, since the respective amplifiers and the capacitors 33 and 412 are included in the same semiconductor IC 10, it is possible to enforce the ground connected to the respective amplifiers and the capacitors 33 and 412 and to reduce the size of the radio-frequency module 1.

For example, in the radio-frequency module 1, the inductor 411 may be included in the semiconductor IC 10.

With the above configuration, it is possible to further reduce the size of the radio-frequency module 1.

For example, in the radio-frequency module 1, the LC series circuits 41 and 42 may be included in the semiconductor IC 10. In a plan view of the module substrate 60, the semiconductor IC 10 may have the outer sides 10P and 10Q that are opposed to each other and, for the LC series circuits 41 and 42, the outer side 10P, the LC series circuit 41, the carrier amplifier 11, the peak amplifier 12, the LC series circuit 42, and the outer side 10Q may be sequentially arranged.

With the above configuration, since the LC series circuit 41 and the LC series circuit 42 are arranged with the carrier amplifier 11 and the peak amplifier 12 sandwiched therebetween, it is possible to ensure the distance between the LC series circuit 41 and the LC series circuit 42. Accordingly, it is possible to suppress the electromagnetic field coupling between the LC series circuit 41 and the LC series circuit 42.

For example, in the radio-frequency module 1, in a plan view of the module substrate 60, the capacitor 33 may be arranged between the carrier amplifier 11 and the peak amplifier 12 in the semiconductor IC 10.

With the above configuration, since the space of the semiconductor IC 10 is capable of being effectively used, it is possible to contribute to the reduction in size of the radio-frequency module 1.

For example, in the radio-frequency module 1, the carrier amplifier 11 may include the multiple first amplifying elements that are cascade-connected to each other and the peak amplifier 12 may include the multiple second amplifying elements that are cascade-connected to each other. In a plan view of the module substrate 60, the capacitor 33 may be arranged between the carrier amplifier 112 closest to the output terminal of the carrier amplifier 11, among the multiple first amplifying elements, and the peak amplifier 122 closest to the output terminal of the peak amplifier 12, among the multiple second amplifying elements, in the semiconductor IC 10.

With the above configuration, in the configuration in which the capacitor 33 is connected between the output terminal of the carrier amplifier 11 and the output terminal of the peak amplifier 12, since the wiring path between the output terminal of the carrier amplifier 11 and the output terminal of the peak amplifier 12 is capable of being shortened, it is possible to realize the reduction in the transmission loss and the reduction in size of the radio-frequency module 1.

For example, in the radio-frequency module 1, the input-side coil 201, the output-side coil 202, and the transmission lines 31 and 32 may be composed of planar conductors formed on the surface of the module substrate 60 or in the module substrate 60.

With the above configuration, it is possible to reduce the size of the radio-frequency module 1.

The communication apparatus 8 according to the present aspect includes the RFIC 7 that processes the radio-frequency signal and the radio-frequency module 1 that transmits the radio-frequency signal between the RFIC 7 and the antenna 6.

With the above configuration, it is possible to realize the advantages of the radio-frequency module 1 in the communication apparatus 8.

Second Aspect

Although the voltage-combined Doherty amplifier circuit is described in the first aspect, a current-combined Doherty amplifier circuit is described in the present aspect.

2. Circuit Configuration of Radio-Frequency Module 2 and Communication Apparatus 9

Figure 4:
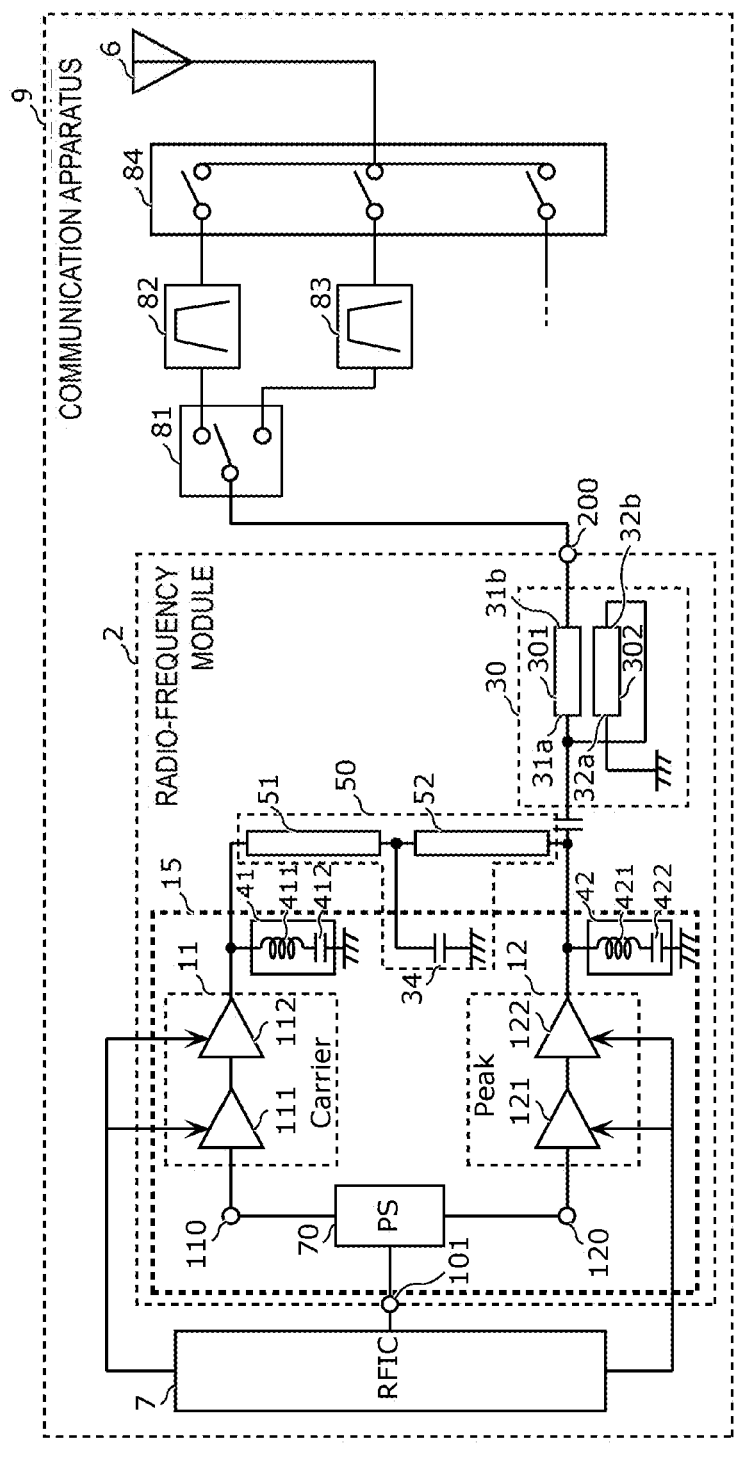
FIG. 4 is a circuit configuration diagram of a radio-frequency module and a communication apparatus according to a second embodiment.

A circuit configuration of a radio-frequency module 2 and a communication apparatus 9 according to the present aspect will be described with reference to FIG. 4. FIG. 4 is a circuit configuration diagram of the radio-frequency module 2 and the communication apparatus 9 according to a second aspect.

2.1 Circuit Configuration of Communication Apparatus 9

First, a circuit configuration of the communication apparatus 9 will be described. As illustrated in FIG. 4, the communication apparatus 9 according to the present aspect includes the radio-frequency module 2, the antenna 6, the RFIC 7, the filters 82 and 83, and the switches 81 and 84. The communication apparatus 9 according to the present aspect differs from the communication apparatus 8 according to the first aspect only in the configuration of the radio-frequency module 2. The configuration of the radio-frequency module 2 in the communication apparatus 9 according to the present aspect, which is different from the configuration of the communication apparatus 8 according to the first aspect, will be described below.

2.2 Circuit Configuration of Radio-Frequency Module 2

Next, a circuit configuration of the radio-frequency module 2 will be described. As illustrated in FIG. 4, the radio-frequency module 2 includes the carrier amplifier 11, the peak amplifier 12, the phase-shift circuit 70, a phase adjustment circuit 50, an impedance conversion circuit 30, the LC series circuits 41 and 42, the signal input terminal 101, and the signal output terminal 200. The radio-frequency module 2 according to the present aspect differs from the radio-frequency module 1 according to the first aspect in that the impedance conversion circuit 30 and the phase adjustment circuit 50 are added, instead of the transformer 20 and the phase adjustment circuit 35. A description of the points of the radio-frequency module 2 according to the present aspect, which are the same as in the radio-frequency module 1 according to the first aspect, is omitted. The following description focuses on points of the radio-frequency module 2 according to the present aspect, which are different from the radio-frequency module 1 according to the first aspect.

The phase adjustment circuit 50 is one example of the first circuit. The phase adjustment circuit 50 includes transmission lines 51 and 52 and a capacitor 34 and shifts the phase of the signal input into the phase adjustment circuit 50 by approximately −90 degrees (delays the phase of the signal input into the phase adjustment circuit 50 by 90 degrees). The transmission line 51 is one example of the first transmission line and is a circuit element that shifts the phase of the signal transmitted through the line. The transmission line 52 is one example of the second transmission line and is a circuit element that shifts the phase of the signal transmitted through the line. The capacitor 34 is one example of the first capacitive element. The capacitor 34 may be a chip capacitor or may be composed of a planar conductor formed in a semiconductor substrate.

One end of the transmission line 51 is connected to the output terminal of the carrier amplifier 11, the other end of the transmission line 51 is connected to one end of the transmission line 52, and the other end of the transmission line 52 is connected to the output terminal of the peak amplifier 12. One end (one electrode) of the capacitor 34 is connected to the other end of the transmission line 51 and the one end of the transmission line 52, and the other end (the other electrode) of the capacitor 34 is grounded.

With the above connection configuration of the phase adjustment circuit 50, since the capacitor 34 is connected between a node between the transmission line 51 and the transmission line 52 and the ground, the total line length of the transmission line 51 and the transmission line 52 is capable of being set to a value shorter than $\frac{1}{4}$ wavelength.

The impedance conversion circuit 30 is one example of a second circuit and includes a primary line 301 and a secondary line 302. The impedance conversion circuit 30 shifts the phase at both ends of the impedance conversion circuit 30 and converts the impedance at a certain conversion ratio. The primary line 301 is one example of a first primary line and is, for example, a transmission line having a length of $\frac{1}{8}$ wavelength or $\frac{1}{16}$ wavelength. One end 31a of the primary line 301 is connected to the other end of the transmission line 52 and the other end 31b of the primary line 301 is connected to the signal output terminal 200. The secondary line 302 is one example of a first secondary line and is, for example, a transmission line having a length of $\frac{1}{8}$ wavelength or $\frac{1}{16}$ wavelength. One end 32b of the secondary line 302 is connected to the one end 31a of the primary line 301 and the other end 32a of the secondary line 302 is grounded. Assuming the primary line 301 and the secondary line 302 are viewed from a direction orthogonal to the direction in which the primary line 301 and the secondary line 302 extend, a first direction from the one end 31a to the other end 31b of the primary line 301 is the same as a second direction from the other end 32a to the one end 32b of the secondary line 302. In the above configuration, the primary line 301 is electromagnetically coupled to the secondary line 302.

The radio-frequency module 2 according to the present aspect does not necessarily include both of the LC series circuits 41 and 42 and it is sufficient for the radio-frequency module 2 according to the present aspect to include at least one of the LC series circuits 41 and 42.

2.3 Amplification Operation of Radio-Frequency Module 2

The amplification operation of the radio-frequency module 2 according to the present aspect will now be described.

Figure 5A:
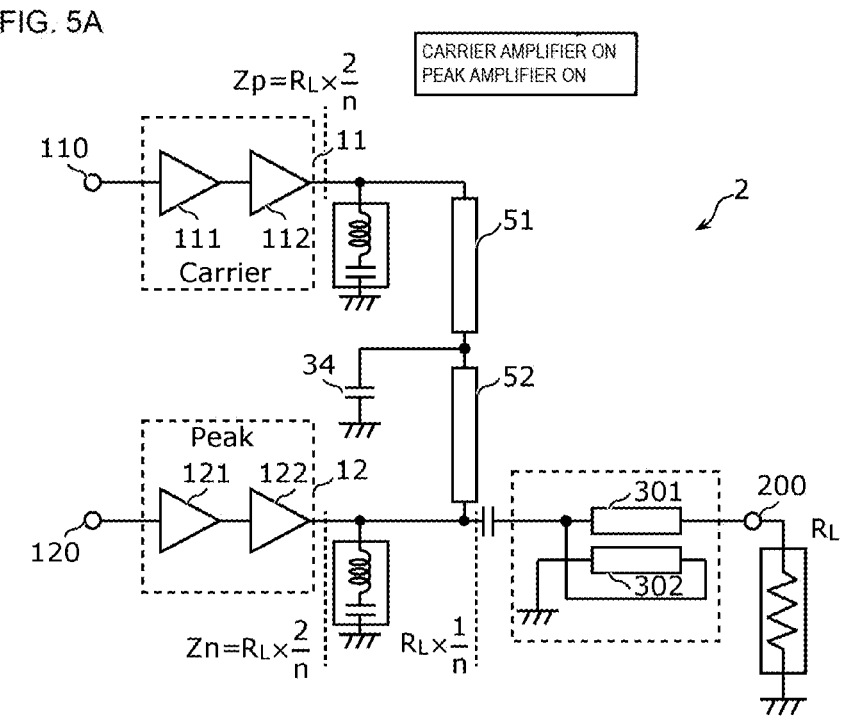
FIG. 5A is a circuit state diagram in input of the large signal in the radio-frequency module according to the second embodiment.
Figure 5B:
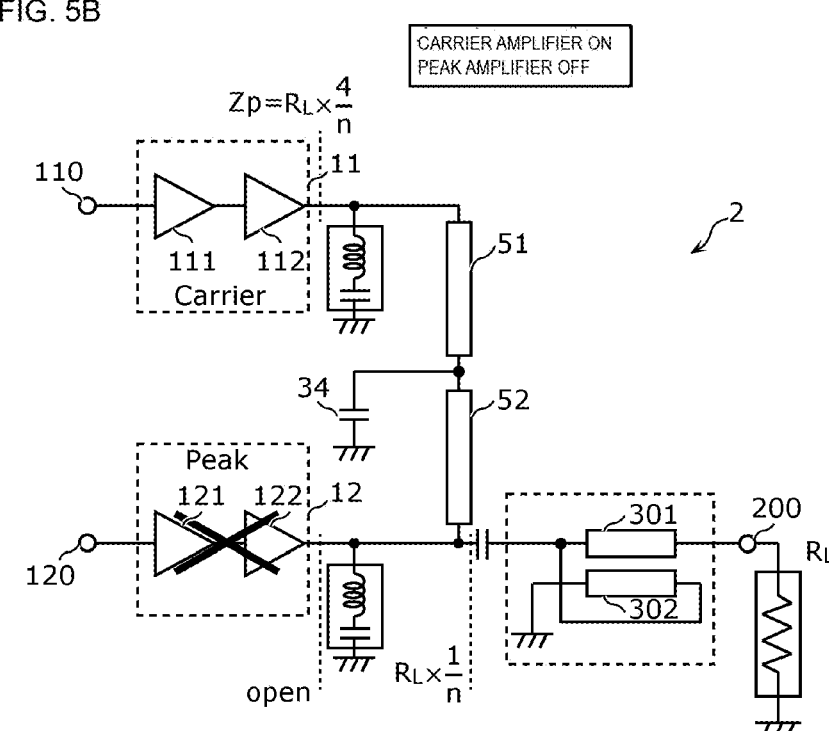
FIG. 5B is a circuit state diagram in input of the small signal in the radio-frequency module according to the second embodiment.

FIG. 5A is a circuit state diagram in input of the large signal in the radio-frequency module 2 according to the second aspect. FIG. 5B is a circuit state diagram in input of the small signal in the radio-frequency module 2 according to the second aspect.

First, as illustrated in FIG. 5A, assuming the carrier amplifier 11 and the peak amplifier 12 operate (are turned on) (in input of the large signal), the output impedance Zp of the carrier amplifier 11 and the output impedance Zn of the peak amplifier 12 are represented according to Equation (3). It is assumed here that the impedance conversion circuit 30 converts the impedance at the input end of the impedance conversion circuit 30 to 1/n with respect to the impedance at the output end of the impedance conversion circuit 30. The impedance of the load connected to the signal output terminal 200 is denoted by RL.

$$Z_p = Zn = RL \times \frac{2}{n} \qquad \text{[Formula 3]}$$

Next, as illustrated in FIG. 5B, assuming the carrier amplifier 11 operates (is turned on) and the peak amplifier 12 does not operate (is turned off) (in input of the small signal), the output impedance Zp of the carrier amplifier 11 is represented according to Equation (4). The output impedance Zn of the peak amplifier 12 at this time is in the open state.

$$Z_p = RL \times \frac{4}{n} \qquad \text{[Formula 4]}$$

As expressed in Equation (3) and Equation (4), the output impedance Zp of the carrier amplifier 11 in input of the small signal is twice as high as that in input of the large signal. In other words, since the peak amplifier 12 is in the off state and the output impedance Zp of the carrier amplifier 11 is made high in input of the small signal, the radio-frequency module 2 is capable of operating at a high efficiency.

In contrast, since the carrier amplifier 11 and the peak amplifier 12 operate to output a high-power signal and the output impedance Zn of the peak amplifier 12 is low in input of the large signal, it is possible to suppress the signal distortion.

2.4 Arrangement Configuration of Components in Radio-Frequency Module 2

Next, a mounting configuration of the components in the radio-frequency module 2 according to the second aspect will be described.

Figure 6A:
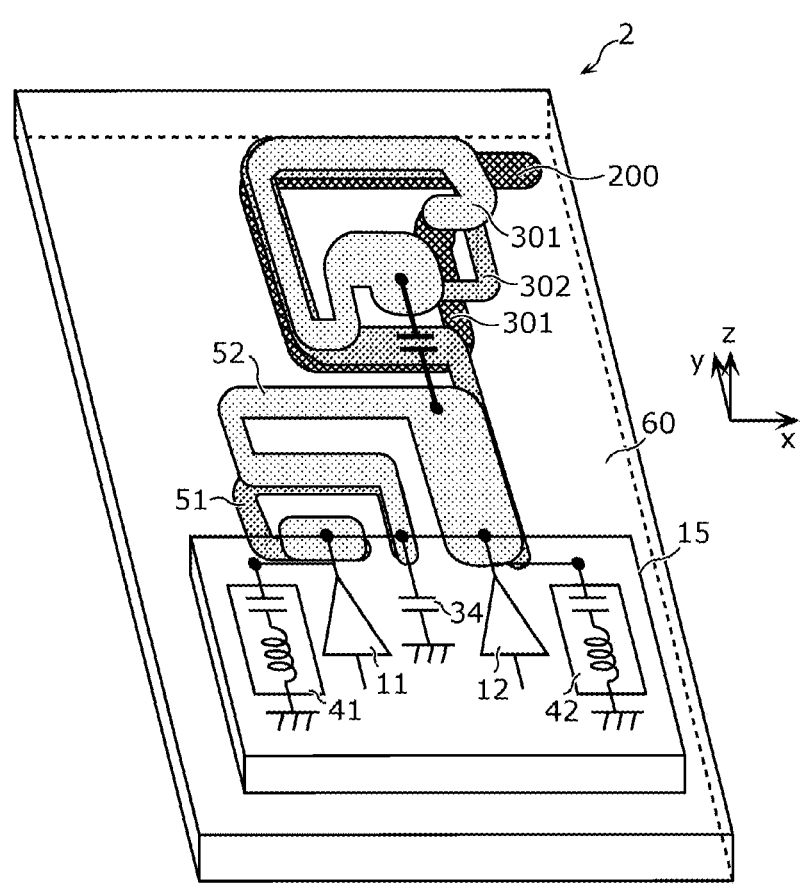
FIG. 6A is a perspective view of the radio-frequency module according to the second embodiment.
Figure 6B:
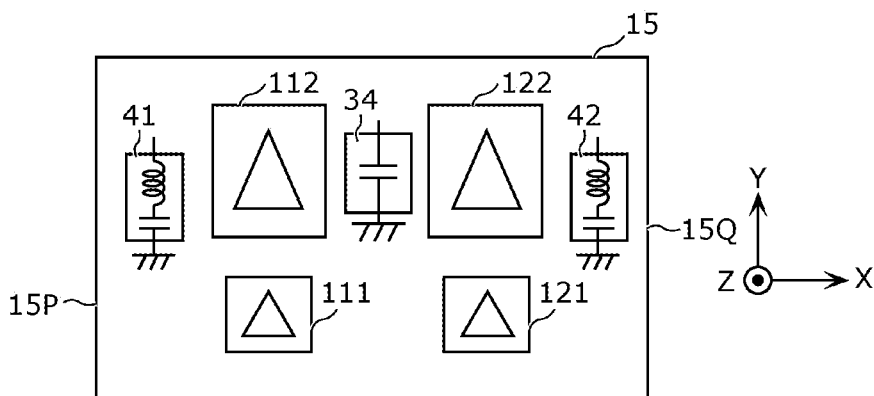
FIG. 6B is a plan view of the radio-frequency module according to the second embodiment.

FIG. 6A is a perspective view of the radio-frequency module 2 according to the second aspect. FIG. 6B is a plan view of the radio-frequency module 2 according to the second aspect. A perspective view of arrangement of the circuit components assuming the main surface of the module substrate 60 is viewed from the positive direction side of the Z axis is illustrated in FIG. 6A. A perspective view of arrangement of the circuit components assuming a main surface of a semiconductor IC 15 is viewed from the positive direction side of the Z axis is illustrated in FIG. 6B. Although marks representing the functions of the respective circuit components may be added to the circuit components so as to enable easy understanding of the arrangement relationship of the respective circuit components in FIG. 6A and FIG. 6B, the marks are not added to the actual respective circuit components. Illustration of wiring with which the respective circuit components are connected to each other is omitted in FIG. 6B.

Although the radio-frequency module 2 may further include a resin member with which the surface of the module substrate 60 and part of the circuit components are covered and a shield electrode layer with which the surface of the resin member is covered, illustration of the resin member and the shield electrode layer is omitted in FIG. 6A.

The radio-frequency module 2 further includes the module substrate 60, in addition to the circuit configuration illustrated in FIG. 4.

The module substrate 60 is a substrate on and in which the circuit components composing the radio-frequency module 2 are mounted. For example, an LTCC substrate having a laminated structure of multiple dielectric layers, an HTCC substrate, a component-embedded board, a substrate including the RDL, or a printed circuit board may be used as the module substrate 60.

The semiconductor IC 15 is arranged on the main surface of the module substrate 60. The semiconductor IC 15 includes the carrier amplifier 11, the peak amplifier 12, the capacitor 34, and the LC series circuits 41 and 42. The semiconductor IC 15 is composed of, for example, CMOS and, specifically, may be manufactured through the SOI process. The semiconductor IC 15 may be made of at least one of GaAs, SiGe, and GaN. The semiconductor material of the semiconductor IC 15 is not limited to the above materials. The phase-shift circuit 70 may be included in the semiconductor IC 15.

The transmission lines 51 and 52, the primary line 301, and the secondary line 302 are formed on the surface of the module substrate 60 or in the module substrate 60. The transmission lines 51 and 52, the primary line 301, and the secondary line 302 are composed of planar conductors formed on the surface of the module substrate 60 or in the module substrate 60. Part of the primary line 301 and the transmission line 52 are formed on or in a first layer of the module substrate 60, the secondary line 302 and the transmission line 51 are formed on or in a second layer thereof, and the remaining portion of the primary line 301 is formed on or in a third layer thereof. The transmission lines 51 and 52, the primary line 301, and the secondary line 302 may be formed on or in the same layer of the module substrate 60 or may be formed on or in different layers thereof. Each of the transmission lines 51 and 52, the primary line 301, and the secondary line 302 may be formed across multiple layers.

With the above configuration, the total line length of the transmission lines 51 and 52 is capable of being set to a value shorter than ¼ wavelength due to the capacitor 34 and the capacitor 34 is included in the semiconductor IC 15 with the carrier amplifier 11 and the peak amplifier 12. Accordingly, it is possible to reduce the size of the radio-frequency module 2.

In addition, in a plan view of the module substrate 60, the capacitor 34 is arranged between the carrier amplifier 11 and the peak amplifier 12 in the semiconductor IC 15. With this configuration, since the space of the semiconductor IC 15 is capable of being effectively used, it is possible to contribute to the reduction in size of the radio-frequency module 2.

Furthermore, in a plan view of the module substrate 60, the capacitor 34 is arranged between the carrier amplifier 112 and the peak amplifier 122 in the semiconductor IC 15. With this configuration, since the wiring path between the output terminal of the carrier amplifier 112 and the output terminal of the peak amplifier 122 is capable of being shortened, it is possible to achieve the reduction in the transmission loss and the reduction in size of the radio-frequency module 2.

The capacitors 412 and 422 are included in the semiconductor IC 15. With this configuration, since the respective amplifiers and the capacitors 412 and 422 are included in the same semiconductor IC 15, it is possible to enforce the ground connected to the respective amplifiers and the capacitors 412 and 422 and to reduce the size of the radio-frequency module 2.

The inductors 411 and 421 are included in the semiconductor IC 15. With this configuration, it is possible to further reduce the size of the radio-frequency module 2.

In a plan view of the module substrate 60, the semiconductor IC 15 has an outer side 15P (the first outer side) and an outer side 15Q (the second outer side) that are opposed to each other and, as for the LC series circuits 41 and 42, the outer side 15P, the LC series circuit 41, the carrier amplifier 11, the peak amplifier 12, the LC series circuit 42, and the outer side 15Q are sequentially arranged. With this configuration, since the LC series circuit 41 and the LC series circuit 42 are arranged with the carrier amplifier 11 and the peak amplifier 12 sandwiched therebetween, it is possible to ensure the distance between the LC series circuit 41 and the LC series circuit 42. Accordingly, it is possible to suppress the electromagnetic field coupling between the LC series circuit 41 and the LC series circuit 42.

2.5 Advantages and so on

As described above, the radio-frequency module 2 according to the present aspect includes the module substrate 60, the carrier amplifier 11 and the peak amplifier 12, the signal output terminal 200, the phase adjustment circuit 50, and the impedance conversion circuit 30. The carrier amplifier 11 and the peak amplifier 12 are included in the semiconductor IC 15 arranged on the main surface of the module substrate 60. The phase adjustment circuit 50 includes the transmission lines 51 and 52 and the capacitor 34. One end of the transmission line 51 is connected to the output terminal of the carrier amplifier 11, the other end of the transmission line 51 is connected to one end of the transmission line 52, and the other end of the transmission line 52 is connected to the output terminal of the peak amplifier 12. One end of the capacitor 34 is connected to the other end of the transmission line 51 and the one end of the transmission line 52 and the other end of the capacitor 34 is grounded. The impedance conversion circuit 30 includes the primary line 301 and the secondary line 302. The one end 31a of the primary line 301 is connected to the other end of the transmission line 52 and the other end 31b of the primary line 301 is connected to the signal output terminal 200. The one end 32b of the secondary line 302 is connected to the one end 31a of the primary line 301 and the other end 32a of the secondary line 302 is grounded. Assuming the primary line 301 and the secondary line 302 are viewed from a direction orthogonal to the direction in which the primary line 301 and the secondary line 302 extend, a first direction from the one end 31a to the other end 31b of the primary line 301 is the same as a second direction from the other end 32a to the one end 32b of the secondary line 302. The capacitor 34 is included in the semiconductor IC 15.

With the above configuration, the total line length of the transmission lines 51 and 52 is capable of being set to a value shorter than ¼ wavelength due to the capacitor 34 and the capacitor 34 is included in the semiconductor IC 15 with the carrier amplifier 11 and the peak amplifier 12. Accordingly, it is possible to reduce the size of the radio-frequency module 2.

For example, the radio-frequency module 2 may further include at least one of the LC series circuit 41 connected between the output terminal of the carrier amplifier 11 and the ground and the LC series circuit 42 connected between the output terminal of the peak amplifier 12 and the ground.

With the above configuration, it is possible to suppress the high-order harmonics occurring from the carrier amplifier 11 and the peak amplifier 12.

For example, in the radio-frequency module 2, the LC series circuit 41 may include the capacitor 412 and the inductor 411 that are connected in series to each other and the capacitor 412 may be included in the semiconductor IC 15.

With the above configuration, since the respective amplifiers and the capacitors 34 and 412 are included in the same semiconductor IC 15, it is possible to enforce the ground connected to the respective amplifiers and the capacitors 34 and 412 and to reduce the size of the radio-frequency module 2.

For example, in the radio-frequency module 2, the inductor 411 may be included in the semiconductor IC 15.

With the above configuration, it is possible to further reduce the size of the radio-frequency module 2.

For example, in the radio-frequency module 2, the LC series circuits 41 and 42 may be included in the semiconductor IC 15. In a plan view of the module substrate 60, the semiconductor IC 15 may have the outer sides 15P and 15Q that are opposed to each other and, as for LC series circuits 41 and 42, the outer side 15P, the LC series circuit 41, the carrier amplifier 11, the peak amplifier 12, the LC series circuit 42, and the outer side 15Q may be sequentially arranged.

With the above configuration, since the LC series circuit 41 and the LC series circuit 42 are arranged with the carrier amplifier 11 and the peak amplifier 12 sandwiched therebetween, it is possible to ensure the distance between the LC series circuit 41 and the LC series circuit 42. Accordingly, it is possible to suppress the electromagnetic field coupling between the LC series circuit 41 and the LC series circuit 42.

For example, in the radio-frequency module 2, in a plan view of the module substrate 60, the capacitor 34 may be arranged between the carrier amplifier 11 and the peak amplifier 12 in the semiconductor IC 15.

With the above configuration, since the space of the semiconductor IC 15 is capable of being effectively used, it is possible to contribute to the reduction in size of the radio-frequency module 2.

For example, in the radio-frequency module 2, the carrier amplifier 11 may include the multiple first amplifying elements that are cascade-connected to each other and the peak amplifier 12 may include the multiple second amplifying elements that are cascade-connected to each other. In a plan view of the module substrate 60, the capacitor 34 may be arranged between the carrier amplifier 112 closest to the output terminal of the carrier amplifier 11, among the multiple first amplifying elements, and the peak amplifier 122 closest to the output terminal of the peak amplifier 12, among the multiple second amplifying elements, in the semiconductor IC 15.

With the above configuration, in the configuration in which the capacitor 34 is connected between the output terminal of the carrier amplifier 11 and the output terminal of the peak amplifier 12, since the wiring path between the output terminal of the carrier amplifier 11 and the output terminal of the peak amplifier 12 is capable of being shortened, it is possible to realize the reduction in the transmission loss and the reduction in size of the radio-frequency module 2.

For example, in the radio-frequency module 2, the primary line 301, the secondary line 302, and the transmission lines 51 and 52 may be composed of planar conductors formed on the surface of the module substrate 60 or in the module substrate 60.

With the above configuration, it is possible to reduce the size of the radio-frequency module 2.

The communication apparatus 9 according to the present aspect includes the RFIC 7 that processes the radio-frequency signal and the radio-frequency module 2 that transmits the radio-frequency signal between the RFIC 7 and the antenna 6.

With the above configuration, it is possible to have an improved radio-frequency module 2 in the communication apparatus 9.

Other Aspects and so on

Although the radio-frequency modules and the communication apparatuses according to the aspects of the present disclosure are described above using the aspects, the radio-frequency modules and the communication apparatuses according to the present disclosure are not limited to the above aspects. Other aspects realized by combining arbitrary components in the above aspects, modifications resulting from making various modifications supposed by the person skilled in the art to the above aspects without departing from the sprit and scope of the present disclosure, various devices incorporating the radio-frequency module and the communication apparatus are also included in the present disclosure.

For example, other circuit elements, wiring, and so on may be provided between the paths with which the respective circuit elements and the signal paths disclosed in the drawings are connected in the radio-frequency modules and the communication apparatuses according to the above aspects.

INDUSTRIAL APPLICABILITY

The present disclosure is widely usable for a communication device, such as a mobile phone, as the radio-frequency module arranged in a multiband front end unit.

REFERENCE SIGNS LIST

1, 2 radio-frequency module
6 antenna
7 RF signal processing circuit (RFIC)
8, 9 communication apparatus
10, 15 semiconductor IC
10P, 10Q, 15P, 15Q outer side
11, 112 carrier amplifier
12, 122 peak amplifier
20 transformer
30 impedance conversion circuit
31, 32, 51, 52 transmission line
31*a*, 32*b* one end
31*b*, 32*a* the other end
33, 34 412, 422 capacitor
35, 50 phase adjustment circuit
41, 42 LC series circuit
60 module substrate
70 phase-shift circuit
81, 84 switch
82, 83 filter
101 signal input terminal
110, 120 terminal
111, 121 pre-amplifier

200 signal output terminal
201 input-side coil
202 output-side coil
301 primary line
302 secondary line
411, 421 inductor

The invention claimed is:

1. A radio-frequency module comprising:
a module substrate;
a first amplifier and a second amplifier;
a transformer including an input-side coil and an output-side coil;
a signal output terminal; and
a first circuit,
wherein the first amplifier and the second amplifier are included in a semiconductor IC arranged on a main surface of the module substrate,
wherein one end of the input-side coil is connected to an output terminal of the first amplifier,
wherein one end of the output-side coil is connected to the signal output terminal,
wherein other end of the output-side coil is grounded,
wherein the first circuit includes
a first transmission line and a second transmission line, and
a first capacitive element,
wherein one end of the first transmission line is connected to an output terminal of the second amplifier, other end of the first transmission line is connected to one end of the second transmission line, and other end of the second transmission line is connected to other end of the input-side coil,
wherein one end of the first capacitive element is connected to the other end of the first transmission line and the one end of the second transmission line and other end of the first capacitive element is grounded, and
wherein the first capacitive element is included in the semiconductor IC.

2. The radio-frequency module according to claim 1, further comprising:
an LC series circuit connected at least one of between the output terminal of the first amplifier and the ground and between the output terminal of the second amplifier and the ground.

3. The radio-frequency module according to claim 2,
wherein the LC series circuit includes a second capacitive element and a first inductor that are connected in series to each other, and
wherein the second capacitive element is included in the semiconductor IC.

4. The radio-frequency module according to claim 3,
wherein the first inductor is included in the semiconductor IC.

5. A communication apparatus comprising:
a signal processing circuit that processes a radio-frequency signal; and
the radio-frequency module according to claim 3, which transmits the radio-frequency signal between the signal processing circuit and an antenna.

6. A communication apparatus comprising:
a signal processing circuit that processes a radio-frequency signal; and
the radio-frequency module according to claim 2, which transmits the radio-frequency signal between the signal processing circuit and an antenna.

7. The radio-frequency module according to claim 1, comprising:

a first LC series circuit connected between the output terminal of the first amplifier and the ground; and a second LC series circuit connected between the output terminal of the second amplifier and the ground, wherein the first LC series circuit and the second LC series circuit are included in the semiconductor IC, and wherein, in a plan view of the module substrate, the semiconductor IC has a first outer side and a second outer side that are opposed to each other and, as for first LC series circuit and the second LC series circuit, the first outer side, the first LC series circuit, the first amplifier, the second amplifier, the second LC series circuit, and the second outer side are sequentially arranged.

8. The radio-frequency module according to claim 1, wherein, in a plan view of the module substrate, the first capacitive element is arranged between the first amplifier and the second amplifier in the semiconductor IC.

9. The radio-frequency module according to claim 8, wherein the first amplifier includes a plurality of first amplifying elements that are cascade-connected to each other, wherein the second amplifier includes a plurality of second amplifying elements that are cascade-connected to each other, and wherein, in a plan view of the module substrate, the first capacitive element is arranged between the first amplifying element closest to the output terminal of the first amplifier, among the plurality of first amplifying elements, and the second amplifying element closest to the output terminal of the second amplifier, among the plurality of second amplifying elements, in the semiconductor IC.

10. The radio-frequency module according to claim 1, wherein the input-side coil, the output-side coil, the first transmission line, and the second transmission line are composed of planar conductors formed on a surface of the module substrate or in the module substrate.

11. A communication apparatus comprising:

a signal processing circuit that processes a radio-frequency signal; and the radio-frequency module according to claim 1, which transmits the radio-frequency signal between the signal processing circuit and an antenna.

12. A radio-frequency module comprising:

a module substrate;

a first amplifier and a second amplifier;

a signal output terminal; and a first circuit and a second circuit, wherein the first amplifier and the second amplifier are included in a semiconductor IC arranged on a main surface of the module substrate, wherein the first circuit includes a first transmission line and a second transmission line, and a first capacitive element, wherein one end of the first transmission line is connected to an output terminal of the first amplifier, other end of the first transmission line is connected to one end of the second transmission line, and other end of the second transmission line is connected to an output terminal of the second amplifier, wherein one end of the first capacitive element is connected to the other end of the first transmission line and the one end of the second transmission line and other end of the first capacitive element is grounded, wherein the second circuit includes a first primary line, and a first secondary line, wherein one end of the first primary line is connected to the other end of the second transmission line and other end of the first primary line is connected to the signal output terminal, wherein one end of the first secondary line is connected to the one end of the first primary line and other end of the first secondary line is grounded, wherein, assuming the first primary line and the first secondary line are viewed from a direction orthogonal to the direction in which the first primary line and the first secondary line extend, a first direction from the one end to the other end of the first primary line is the same as a second direction from the other end to the one end of the first secondary line, and wherein the first capacitive element is included in the semiconductor IC.

13. The radio-frequency module according to claim 12, wherein the first primary line, the first secondary line, the first transmission line, and the second transmission line are composed of planner conductors formed on a surface of the module substrate or in the module substrate.

14. A communication apparatus comprising:

a signal processing circuit that processes a radio-frequency signal; and the radio-frequency module according to claim 12, which transmits the radio-frequency signal between the signal processing circuit and an antenna.

15. The radio-frequency module according to claim 12, further comprising:

an LC series circuit connected at least one of between the output terminal of the first amplifier and the ground and between the output terminal of the second amplifier and the ground.

16. The radio-frequency module according to claim 15, wherein the LC series circuit includes a second capacitive element and a first inductor that are connected in series to each other, and wherein the second capacitive element is included in the semiconductor IC.

17. The radio-frequency module according to claim 16, wherein the first inductor is included in the semiconductor IC.

18. The radio-frequency module according to claim 12, comprising:

a first LC series circuit connected between the output terminal of the first amplifier and the ground; and a second LC series circuit connected between the output terminal of the second amplifier and the ground, wherein the first LC series circuit and the second LC series circuit are included in the semiconductor IC, and wherein, in a plan view of the module substrate, the semiconductor IC has a first outer side and a second outer side that are opposed to each other and, as for first LC series circuit and the second LC series circuit, the first outer side, the first LC series circuit, the first amplifier, the second amplifier, the second LC series circuit, and the second outer side are sequentially arranged.

19. The radio-frequency module according to claim 12, wherein, in a plan view of the module substrate, the first capacitive element is arranged between the first amplifier and the second amplifier in the semiconductor IC.

20. The radio-frequency module according to claim 19, wherein the first amplifier includes a plurality of first amplifying elements that are cascade-connected to each other, wherein the second amplifier includes a plurality of second amplifying elements that are cascade-connected to each other, and wherein, in a plan view of the module substrate, the first capacitive element is arranged between the first amplifying element closest to the output terminal of the first amplifier, among the plurality of first amplifying elements, and the second amplifying element closest to the output terminal of the second amplifier, among the plurality of second amplifying elements, in the semiconductor IC.

* * * * *